United States Patent [19]

Benbow et al.

[11] 4,147,983

[45] Apr. 3, 1979

[54] REMOTE METER READING MAXIMUM KW DEMAND METER

[75] Inventors: Eugene C. Benbow; Rodney V. Adams, both of Raleigh, N.C.

[73] Assignee: Westinghouse Electric Corp., Pittsburgh, Pa.

[21] Appl. No.: 853,372

[22] Filed: Nov. 21, 1977

[51] Int. Cl.² .................. G01R 11/64; G06C 15/42
[52] U.S. Cl. .................. 324/103 R; 235/144 MA; 340/151
[58] Field of Search .................. 324/103 R; 340/150, 340/151, 201 P; 346/14 MR; 235/144 MA

[56] References Cited

U.S. PATENT DOCUMENTS 2,424,689  7/1947  Hamill .................. 324/103 R
3,609,691  9/1971  Stewart, Jr. .................. 340/151

Primary Examiner—Rudolph V. Rolinec
Assistant Examiner—Ernest F. Karlsen
Attorney, Agent, or Firm—R. W. Smith

[57] ABSTRACT

A remote meter reading maximum KW demand meter includes a register having an integral pulse initiator. The register drives the pulse initiator in response to maximum demand measuring movement of the meter. In one mode of operation, demand indicating pulses are generated incrementally as the increments of measured KW demand increases. In another mode, the pulse initiator generates a continuous pulse stream responsive to the total maximum KW demand measured during a predetermined billing period when the register is reset by a remotely actuated solenoid.

5 Claims, 3 Drawing Figures

REMOTE METER READING MAXIMUM KW DEMAND METER

CROSS-REFERENCE TO RELATED APPLICATIONS

This invention is related to U.S. Pat. No. 3,421,084 issued Jan. 6, 1969 and assigned to the assignee of this invention.

BACKGROUND OF THE INVENTION

1. Field of the Invention

This invention relates to utility meter reading telemetry systems and more particularly to a remote meter reading KW maximum demand meter having a pulse initiator for generating pulses directly related to measured kilowatt demand.

2. Description of the Prior Art

In electric utility remote meter reading telemetry systems, kilowatthour meters are often equipped with mechanical and electronic pulse initiators. Pulses are produced in response to the meter movement when measuring electric energy consumption. Examples of pulse initiators or generators driven by the gearing of a watthour meter dial register are described in U.S. Pat. Nos. 2,335,529; 2,451,971; 2,894,146; and 3,315,192. The electric energy indicating pulses produced by these generators actuate a remote totalizer or remote register or an associated encoder. The meter reading encoders are adapted to transmit coded meter reading pulses to a central station.

Often systems for remote metering of electric energy include apparatus for measuring peak or maximum power demand usage. It is known to utilize the kilowatthour indicating pulses as inputs to a recording or indicating demand meter device such as described in U.S. Pat. Nos. 1,742,073; 2,285,859; and 2,832,067. Also, the kilowatthour pulses are recorded on magnetic tape also having a simultaneous record of time spaced pulses. Examples of the aforementioned watthour meter tape recording systems are described in U.S. Pat. Nos. 3,148,329; and 3,470,470. The watthour energy pulses are also applied to totalizing systems such as disclosed in U.S. Pat. No. 3,072,888 or load regulation devices such as disclosed in U.S. Pat. No. 3,296,452 also requiring a source of time interval signals to calculate the power usage or power demand. Each of the aforementioned power demand measuring devices derive KW demand by effectively dividing the kilowatthour pulse values by a demand interval, typical fifteen or thirty minutes, as is well known. Accordingly, a number of kilowatthour pulses occurring during each demand interval is correlated to the power demand for that interval. The highest measured demand occurring in any of the demand intervals of a billing period, normally on a monthly basis, defines the maximum or peak KW demand for billing purposes.

Direct meter readings of measured maximum demand at kilowatthour meter devices equipped with dial reading demand registers are well known and are described and claimed in U.S. Pat. Nos. 2,259,314; 3,421,084; 3,805,154; and 3,913,014 all assigned to the assignee of this invention. The aforementioned registers provide two dial readings including maximum demand and electric energy as is typical in such registers. The aforementioned meter registers do not provide a direct electronic pulse representation of the maximum demand for remote meter reading telemetry systems.

SUMMARY OF THE INVENTION

In accordance with the present invention, a remote meter reading maximum KW demand meter includes a dial demand register including an integral pulse initiator. The pulse initiator equipped register is driven in response to electric energy metering movement in accordance with the consumption of electric energy. The demand register gear train has mounted therein a rotating member carrying indicia rotated in response to the demand register gearing. A sensing unit is responsive to the movement of the indicia to produce electrical pulses representative of kilowatt demand. After zero reset of the maximum demand register, the pulse initiator is driven in response to consumption of electric energy during a first demand interval and thereafter by the amount that electric energy consumption during a demand interval that exceeds consumption of any previous demand interval. Accordingly, the pulse initiator is incrementally operated as increases of measured KW demand occur during a billing period.

A reset solenoid is associated with the demand register for actuating a register reset shaft. Energization of the solenoid activates the solenoid plunger to drive the reset shaft gearing and return the register dial pointers to an initial or zero position. This is typically done at the beginning of each new billing period. Accordingly, the pulse initiator is continuously operated during the register reset operation. A stream of pulse initiator pulses is generated to indicate the total maximum KW demand measured during the billing period. Since the pulse initiator produces intermittent pulses with each increase of KW demand during the predetermined measuring period or a continuous pulse stream when the measuring period is terminated by reset of the demand register of this invention, the peak demand levels can be monitored as they occur or the peak demand can be read out at the end of the measuring period.

A principal feature of the present invention is to provide a KW maximum demand register with an integral pulse initiator mounted to produce pulses in response to the measured peak demand. Another general feature of the invention is to provide a pulse initiator equipped demand register with a reset solenoid operated in response to remote energization so that the pulse initiator produces pulses having a total count representative of the maximum demand measured prior to reset. These and other features will become apparent from the description of the preferred embodiment illustrated in the drawings briefly described hereinafter.

DESCRIPTION OF THE PREFERRED EMBODIMENT

Figure 1:
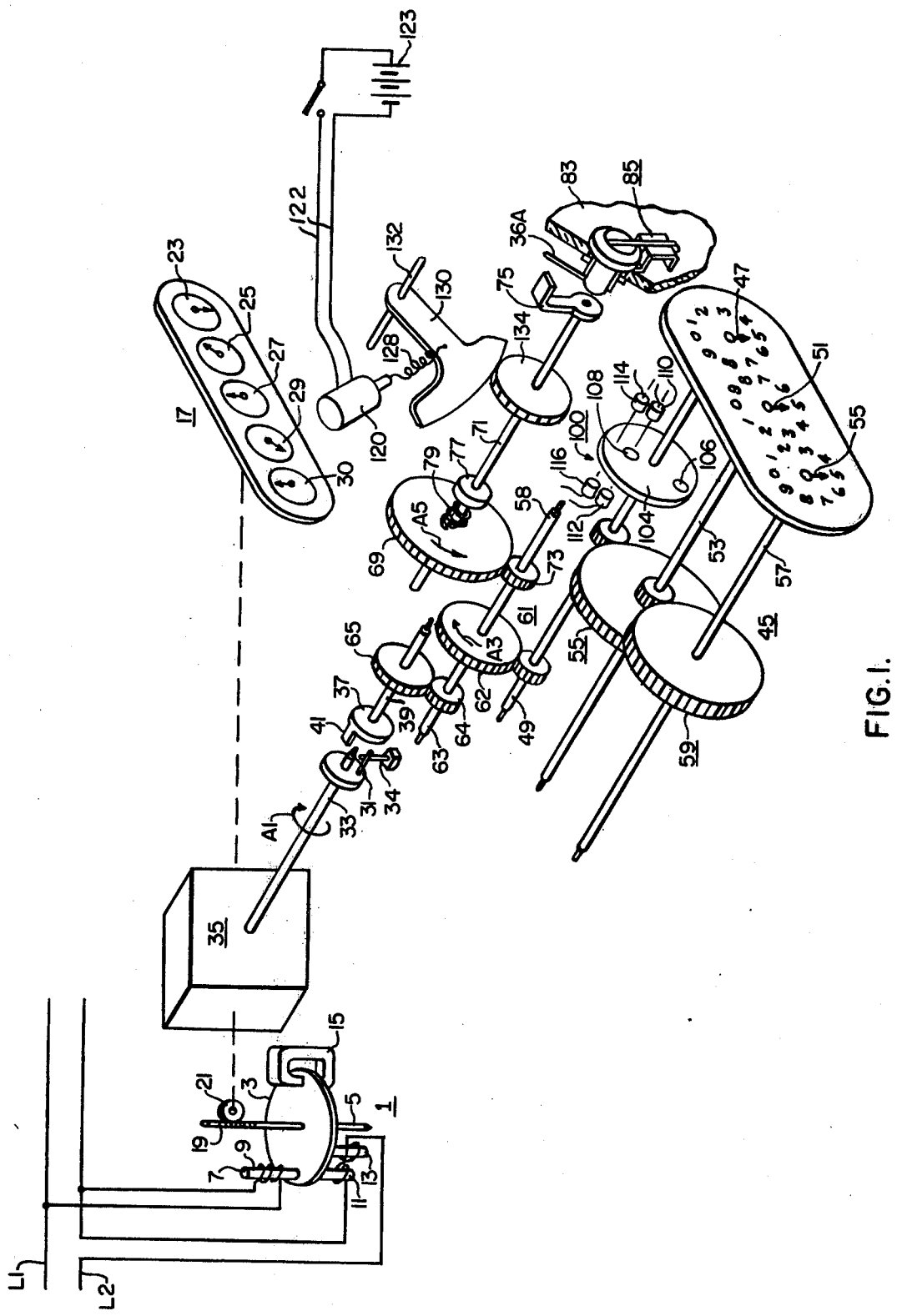
FIG. 1 is a schematic view with parts in perspective showing an electric power measuring device embodying a maximum KW demand register including a pulse initiator made in accordance with the present invention.

Referring now to the drawings in more detail, and particularly to FIG. 1, there is shown a schematic view corresponding to FIG. 1 of U.S. Pat. No. 3,421,084 issued Oct. 5, 1967 and assigned to the assignee of this invention, and incorporated by reference herein. The same reference characters employed in the aforementioned patent are also used to identify the corresponding elements in FIG. 1. The numerals commencing with one hundred and above are employed to designate the parts of FIG. 1 which are added to complete the present invention.

The general arrangement of FIG. 1 is first described, it being understood that further explanation of the corresponding parts included in the aforementioned U.S. Pat. No. 3,421,084 may be had by reference to the description and additional figures therein. Electrical energy supplied to a load by conductors L1 and L2 is measured a kilowatthour meter 1 of conventional construction. Such watthour meters include a conductive disc 3 which is rotated in response to the magnetic fields developed by a voltage coil 9 and current coils 11 and 13 connected to the conductors L1 and L2 in a well known manner. Rotations of the disc 3 are counted by a kilowatthour or electric energy register 17 which is coupled to a worm wheel 21 associated with the shaft 5. The register 17 is a multi-dial decade type having dials 23, 25, 27, 29 and 30 calibrated to directly indicate the total electric energy consumption in kilowatthours of a load supplied through the conductors L1 and L2.

For measuring maximum KW demand, the meter 1 also rotates an operating member or pusher 31 and a shaft 33 through pusher drive 35. At the beginning of each demand interval the shaft 33 occupies a predetermined starting or zero position, shown in FIG. 1, and abuts a stop pin 34. The shaft 33 is rotated in a clockwise direction, indicated by the arrow A1 as viewed in FIG. 1, in accordance with the energy consumption during the demand interval. A typical demand interval has a duration of thirty minutes. At the end of the demand interval the shaft 33 and associated pusher 31 are reset to the zero position by a reset mechanism including a clock motor, not shown. For example, the shaft 33 may be operated in the same manner as the sleeve 22 described in U.S. Pat. No. 2,259,314 issued Oct. 14, 1941 and assigned to the assignee of this invention. The aforementioned U.S. Pat. No. 2,259,314 is incorporated by reference herein.

The pusher 31 engages and drives the pushed member or lug 41 projecting into the path of rotation of the pusher 31. When the pusher 31 is reset at the end of a demand interval, the shaft 39 carrying the lug 41 is retained in its operated position by the spring leaf 43. During any demand interval when the pusher 31 is rotated to an angle greater than that occurring during any previous demand interval, the pusher 31 will engage the lug 41 for the purpose of advancing the lug to a new position to register a higher KW demand.

The position of the lug 41 and shaft 39 is indicated on the plural order dials having the pointers 47, 51 and 55 of the demand register 45. The rotation of the shaft 39 is coupled through gears 65, 64, 62 and the gearing 61 to the shafts carrying the pointers 47, 51 and 55. The register 45 is thus permanently coupled to the shaft 39 through the gearing 61 and 63 and the gear ratios are provided to read the maximum demand in kilowatts and the dials associated with the pointers 47, 51 and 55. When the consumption of energy by a load supplied by the conductors L1 and L2 is insufficient to bring the pusher 31 into engagement with the lug 41, the condition of the demand register 45 remains unchanged and the position of the pointers 47, 51 and 55 do not change.

Resetting of the demand register 45 is affected at the end of a predetermined measuring or billing period by rotation of the shaft 58 in a resetting direction which is clockwise as indicated by the directional arrow A3. The resetting rotation of the shaft 58 is produced by rotation of the shaft 71 moved in a counterclockwise direction as indicated by the directional arrow A5 and coupled to the shaft 58 through the gears 69 and 73. As the pushed member or lug 41 is rotated during the billing period, the shaft 71 is also rotated by rotation of the gear 69 which is rotationally mounted on the shaft and is resiliently coupled thereto by the helical spring 79 secured at opposite ends to the gear 69 and collar 77. The reset unit 85 is turned manually so as to engage the reset arm 75 attached to the end of the shaft 71. The reset unit 85 is mounted through a hole at the face of a glass cover 83 of the meter 1. The reset unit 85 is manually rotated to engage the reset arm 75 and rotate the shafts 71 and 58 and in turn the shaft 39 to return the pushed member 41 to a zero or starting position in engagement with the position of the pusher 31 as shown in FIG. 1.

Having described the general arrangement for operating the KW demand register 45 hereinabove, the pulse initiator 100 and remote reset unit 102 provided for the register 45 in accordance with the present invention is described hereinafter.

The pulse initiator 100 is a radiometric type having a disc 104 defining a rotating member carried on the first order pointer shaft 49. A disc 104 includes indicia formed by two holes 106 and 108 disposed at different radii of the disc. The holes 106 and 108 of the disc 104 are rotated in different circular paths by rotation of the shaft 49. The sensing portion of the pulse initiator 100 includes two radiation source-pickup pairs wherein one pair includes a source 110 and an aligned pickup 112. The second pair includes a source 114 and pickup 116 aligned therewith. The source 110 and pickup 112 are optically coupled together by a path intersecting the circular path of the hole 108. Similarly, the source 114 and pickup are optically coupled by a path intersecting the circular path of the hole 106. The sources 110 and 114 are light emitting diodes and the pickups 112 and 116 and photo or radiation sensitive semiconductor devices. Accordingly the pickups 112 and 116 are activated when the holes 104 and 106, respectively, are aligned therewith to provide optical paths coupling radiations between the two source-pickup pairs. The source 110 and pickup 112 and source 114 and pickup 116 are connected in the pulse initiator circuit 119 shown in FIG. 2 and described further hereinbelow.

The remote reset unit 102 includes a reset solenoid 120 mounted in the register 45. The coil of the solenoid 120 includes a pair of terminal leads 122 connected to a remote electrical source of energization 123. A plunger 126 of the solenoid 120 is coupled through a spring 128 to a sector gear 130. A shaft 132 of the register 45 has the sector gear 130 pivotally mounted thereon. The gear teeth of the sector gear 130 mesh with a gear 134 carried by the shaft 71. Accordingly, the sector gear 130 is drivingly connected to the shaft 71. The rotation of the shaft 71 during the maximum demand measuring operation of the register 45 concurrently rotates the sector gear 130 about the shaft 132.

The resetting operation of the remote reset arrangement 102 effects reset of the register and the associated pointers 47, 51 and 55 to the zero position upon energization of the solenoid 120 through the pair of terminal conductors 122. The solenoid coil actuates the plunger 126 to rotate the sector gear 130 and rotate the shaft 71 through the gear 134 and return the pushed member 41 to the original and zero starting position as well as returning the pointers 47 toward 51 and to divide to the zero position.

Figure 2:
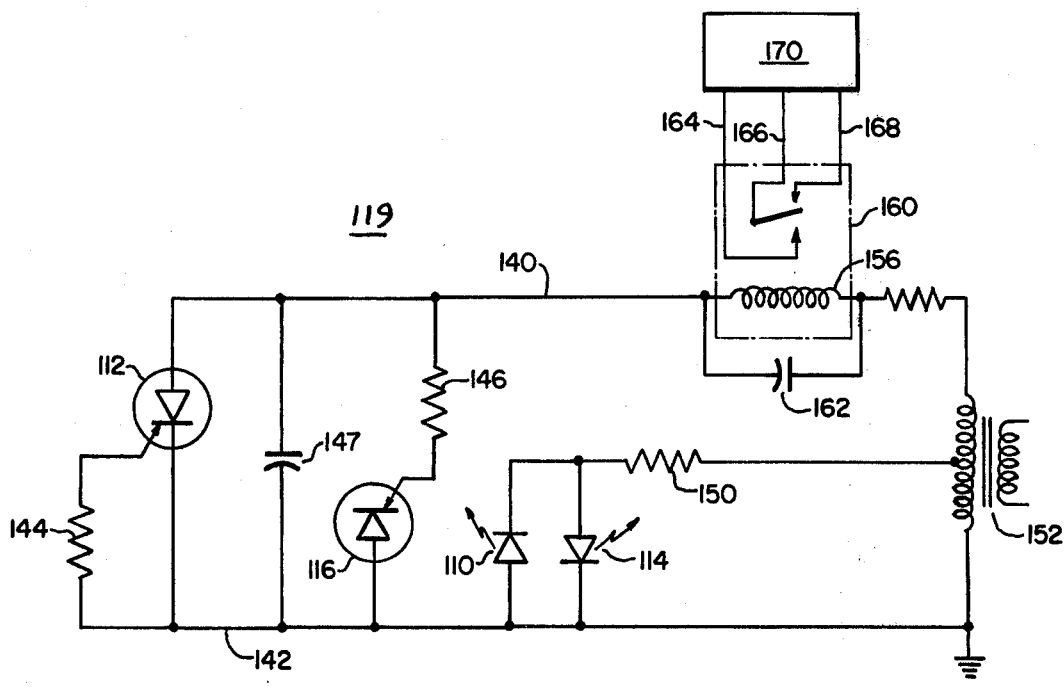
FIG. 2 is an electrical circuit diagram of the pulse initiator device included in FIG. 1.

Referring to FIG. 2 wherein there is shown the pulse initiating circuit 119 which is an opto-electronic sensing type including the radiation source-pickup pairs 110–112 and 114–116. The pulse initiating circuit is of a type disclosed in the U.S. Pat. No. 3,733,493 issued May 15, 1973 and assigned to the assignee of the present invention. The sources 110 and 114 being formed by light emitting diode devices emit radiations to activate the pickups 112 and 116. Phototransistor devices form the pickups 112 and 116 and are activated by becoming conductive when receiving the radiations of the sources 110 or 114. The pickups are connected to the conductors 140 and 142 and have gating electrodes appropriately connected by the resistors 144 and 146 to the conductors 140 and 142 as shown in FIG. 2. A capacitor 147 is also connected across pickups 112 and 116 as shown. The sources 110 and 114 are connected in parallel and through a resistor 150 connected to the center tap of a power supply transformer 152 having one secondary terminal thereof connected to the conductor 142 and to terminals of the sources 110 and 114. The other secondary terminal of the power supply transformer 152 is connected in series with a resistor 154 and the coil 156 of a mercury wetted relay 160. The capacitor 162 is connected in shunt with the coil 156. The contracts of the relay 160 are connected to three output terminal conductors 164, 166, and 168 to form the sending portion of a three-wire telemetry system which is well known in remote utility reading systems. The conductors 164, 166 and 168 are connected to a pulse receiver 170 of a well-known type which includes magnetic recorders, pulse totalizers, pulse encoders, and the like.

The photoelectronic pickups 112 and 116 are alternately energized by the radiations from the LED sources 110 and 114 in accordance with the rotation of the disc 104 having the hole indicia 106 and 108. The alternate conduction of the pickups 112 and 116 produce impulses which actuate the mercury wetted relay device 160 to operate the relay contacts and produce pulses in the conductors 164, 166 and 168. Accordingly, each pulse initiated by the relay 160 is representative of a predetermined quantum of power demand directly related to the indications of power demand at the register pointers 47, 51 and 55.

Figure 3:
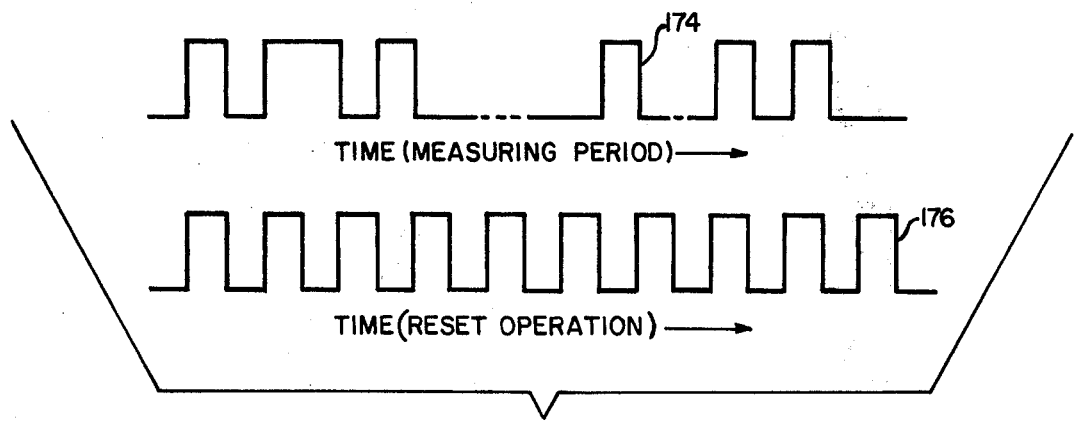
FIG. 3 is a time graph of two pulse signals occurring at different modes of operation of the pulse initiator shown in FIGS. 1 and 2.

In FIG. 3 two time graphs of pulses 174 and 176 are shown as produced on the output conductors 164, 166 and 168. The graph of pulses 174 are produced during the measuring period, which may be a month, as power demand increases. According, there may be periods of days between pulses. If the peak demand occurs early in the period, a few weeks could pass without any pulses being generated and no new pulses will be generated until after the register is reset. This has the advantage of utilizing the demand register of this invention for load control applications. The graph of pulses 176 are generated during the above-described reset operation. The resetting operation requires only seconds and substantially less than a minute. The total number of pulses is representative of the peak demand occurring during the measuring or billing period.

In operation of the remote meter reading maximum KW demand meter of this invention, the register 45 is initially operative at a zero setting or condition. The consumption of electrical energy as supplied to a load to the conductors L1 and L2 proportionally rotates the disc 3 of the watthour meter 1. The pusher 31 is rotated to drive the pushed member 41 during the first demand interval. The gearing of the demand register 45 drives the pointers 47, 51, 55 by an amount proportional to the consumption of electrical energy during that demand interval. The pointer shaft 49 of the demand register gearing rotates the disc 104 so that the radiation sensitive pickups 112 and 116 are alternately activated to produce pulses at the output conductors 164, 166 and 168 of the pulse initiating circuit as shown in the graph of pulses 174. The pusher 31 is returned to its starting position at the end of each demand interval. If the subsequent consumption of electrical energy during each demand interval is less than that of the previous demand intervals the pushed member 41 will not be operated and will remain in its most rotated position. Accordingly, the pointer shafts 49, 53 and 57 will remain stationary and the disc 104 will remain stationary so that no additional pulses will be produced by the pulse initiating circuit. When the consumption of electrical energy is higher during a demand interval than any previous demand interval, then the pushed member 41 will be driven by an amount equal to the increased amount of electric consumption during the demand interval. The disc 104 will be rotated by an amount equal to the increased energy consumption so that additional pulses will be produced from the pulse initiating circuit 119. The total of all pulses produced by the pulse initiating circuit during a billing or measuring period will then be equal to the maximum power demand of a load connected to the conductors L1 and L2.

At the end of the billing period, the terminal conductors 122 receive energization from a remote source 123 to activate the sector gear 130. The shaft 71 will have driven the sector gear 130 in accordance with the maximum power demand measured during the billing period. Upon energization of the solenoid 120, the sector gear 130 is rotated to rotate the shaft 71 to return the pushed member 41 to the zero setting. As noted hereinabove, concurrently the demand register gearing is rotated so that the pointer shafts 49, 53, and 57 are returned so that the pointers are at an initial zero indicating position. This will rotate the disc 104 through a corresponding number of revolutions which will be equal to the total of maximum demand measured during the billing period and a corresponding number of pulses will be generated by the pulse initiating circuit. The latter pulses are shown in the graph of pulses 176. For example, if the highest KW demand measured is five hundred and fifty-five as shown in FIG. 1, then the shaft 49 will be rotated five hundred and fifty-five revolutions to produce a corresponding number of pulses at the output of the pulse initiating circuit.

Pulses may be transmitted to the pulse receiver 170 during the accumulation of measured kilowatt demand on the register 45 or at the end of the billing period which will indicate in one transmission of pulses the maximum KW demand that was measured during that particular billing period. Alternatively, the present invention may be utilized in the cumulative type of demand register, such as disclosed in U.S. Pat. No. 2,259,314 issued Oct. 14, 1941. The pulse initiator unit 100 would be mounted on the first shaft 118 of the aforementioned U.S. Pat. No. 2,259,314. The shaft 118 described therein is changed only during the register reset. Accordingly, only the pulses of graph 176 will be produced. Readout of the pulse initiator pulses is sent to a pulse receiver as described hereinabove. The resetting arrangement is modified so as to remotely operate the push rod 154 or reset shaft 128 of the aforementioned U.S. Pat. No. 2,259,314.

It is apparent that the above-described invention may have further modifications and arrangements falling within the spirit and scope of the invention.

We claim:

1. A remote meter reading maximum KW demand meter comprising:
 a multidial decade register including a gear train coupled to plural pointer shafts for indicating the maximum power demand measured during the predetermined demand interval;
 a rotating member carried in said register for rotation in response to rotation of said gear train;
 sensing means responsive to said rotating member rotation for generating pulses representative of a predetermined amount of electrical power demand concurrently indicated by said register wherein said pulses are generated incrementally with increase of measured power demand; and
 reset means for returning said pointer shafts to an initial state so that the sensing means generates the power demand representing pulses in a continuous series of pulses representative of the total maximum demand measured by the meter upon activation of said reset means.

2. The remote meter reading maximum KW demand meter as claimed in claim 1 wherein said reset means includes a solenoid having a plunger coupled to said register gear train for returning said register to a zero start condition when activated by energization from an electrical source.

3. The remote meter reading maximum KW demand meter as claimed in claim 2 wherein said electrical source is located remotely from said meter.

4. The remote meter reading maximum KW demand meter as claimed in claim 1 wherein said rotating member is formed by a disc carried on the lowest order pointer shaft of said plural pointer shafts of said register.

5. The remote meter reading maximum KW demand meter as claimed in claim 4 wherein said sensing means is radiation responsive and said disc includes indicia for optically coupling radiation to said sensing means upon rotation of said disc.

* * * * *